United States Patent
Buschbeck et al.

(10) Patent No.: US 11,927,660 B2
(45) Date of Patent: Mar. 12, 2024

(54) METHOD FOR MEASURING MOTION OF AN OBJECT TO BE IMAGED IN A MEDICAL IMAGING METHOD

(71) Applicant: FORSCHUNGSZENTRUM JÜLICH GMBH, Jülich (DE)

(72) Inventors: Richard Buschbeck, Cologne (DE); Nadim Joni Shah, Jülich (DE)

(73) Assignee: FORSCHUNGSZENTRUM JÜLICH GMBH, Jülich (DE)

(*) Notice: Subject to any disclaimer, the term of this patent is extended or adjusted under 35 U.S.C. 154(b) by 752 days.

(21) Appl. No.: 17/042,459

(22) PCT Filed: May 22, 2019

(86) PCT No.: PCT/EP2019/063175
§ 371 (c)(1),
(2) Date: Sep. 28, 2020

(87) PCT Pub. No.: WO2019/224229
PCT Pub. Date: Nov. 28, 2019

(65) Prior Publication Data
US 2021/0011105 A1    Jan. 14, 2021

(30) Foreign Application Priority Data
May 24, 2018 (DE) .................. 10 2018 208 220.0

(51) Int. Cl.
G01R 33/567     (2006.01)
G01R 33/565     (2006.01)

(52) U.S. Cl.
CPC ... G01R 33/5676 (2013.01); G01R 33/56509 (2013.01)

(58) Field of Classification Search
CPC ...................... G01R 33/5676; G01R 33/56509
See application file for complete search history.

(56) References Cited

U.S. PATENT DOCUMENTS

| 9,940,713 B1 | 4/2018 | Bhat et al. |
| 2011/0221439 A1* | 9/2011 | Posse ............... G01R 33/485 324/307 |

(Continued)

FOREIGN PATENT DOCUMENTS

| CN | 101144853 A | 3/2008 |
| CN | 104620124 A | 5/2015 |

(Continued)

OTHER PUBLICATIONS

Yen, Y., "3D rotation matching using spherical harmonic transformation of k-space navigator," Proc. Intl. Soc. Mag. Reson. Med. vol. 11, 2004. p. 1 (Year: 2004).*

(Continued)

*Primary Examiner* — Keith M Raymond
*Assistant Examiner* — Sean A Frith
(74) *Attorney, Agent, or Firm* — Maier & Maier, PLLC (57) ABSTRACT

A method for determining movement of an object to be imaged in a medical imaging method which includes at least one Magnetic Resonance Imaging, wherein the method comprises the following steps determining first coefficients of a mathematical transformation based on first navigator data of the object, wherein the first navigator data are recorded by a magnetic resonance tomograph (100) using a first spherical Lissajous navigator in the k-space with $k_r<0.2$/cm, preferably $k_r<0.15$/cm, and particularly preferably $k_r<0.1$/cm, wherein $k_r$ represents the absolute value of the wave vector k.

19 Claims, 5 Drawing Sheets

(56) References Cited

U.S. PATENT DOCUMENTS

2014/0292331 A1    10/2014   Fautz
2017/0038448 A1*   2/2017   Beck ................ G01R 33/56509

FOREIGN PATENT DOCUMENTS

CN          105980875 A     9/2016
DE      102013205402 A1   10/2014

OTHER PUBLICATIONS

Ullisch, M, et al., "Rigid Body Motion Detection with Lissajous Navigator Echoes," Proc. Intl, Soc. Mag. Reson. Med. vol. 17, 2009. p. 1 (Year: 2009).*

Marcus Gorge Ullisch, "A Navigator-Based Rigid Body Motion Correction for Magnetic Resonance Imaging", Jan. 24, 2012, 172 pgs (Year: 2012).*

Office Action dated Feb. 8, 2023, in corresponding Chinese Application No. 201980034775.1, 18 pages.

International Search Report dated Aug. 8, 2019 in corresponding International application No. PCT/EP2019/063175; 6 pages.

Ullisch M.G. et al. "Rigid Body Motion Detection with Lissajous Navigator Echoes" Proceedings of the International Society for Magnetic Resonance in Medicine, 17th Scientific Meeting & Exhibition, Hawaii, USA, Apr. 8, 2009 (Apr. 8, 2009), p. 4650, 1 pg.

Andreu F. Costa et al. "Using the axis of rotation of polar navigator echoes to rapidly measure 3D rigid-body motion" Magnetic Resonance in Medicine., US, vol. 53, No. 1, Jan. 2005 (Jan. 2005), pp. 150-158, 10 pgs.

Fu Z.W. et al. "Optimization of Orbital Navigator Echo Technique in Motion Measurement of MR Imaging" Proceedings of the International Society for Magnetic Resonance in Medicine, SMR Second Meeting, San Francisco, USA, Aug. 6, 1994 (Aug. 6, 1994), 1 pg.

Yen Y-F. "3D Rotation Matching Using Spherical Harmonic Transformation of k-Space Navigator" Proceedings of the International Society for Magnetic Resonance in Medicine, 12th Scientific Meeting & Exhibition, Kyoto, Japan, May 15, 2004 (May 15, 2004), p. 2154, 1 pg.

Ullisch M.G. et al. "Towards Lissajous navigator-based motion correction for MR-PET" Proceedings of the International Society for Magnetic Resonance in Medicine, Joint Annual Meeting ISMRM-ESMRMB, Sweden, May 1, 2010 (May 1, 2010), p. 3060, 1 pg.

Richard P. Buschbeck et al. "3D rigid-body motion information from spherical Lissajous navigators at small k-space radii: A proof of concept" Magnetic Resonance in Medicine., US, vol. 82, No. 4, Jun. 26, 2019 (Jun. 26, 2019), pp. 1462-1470, 10 pgs.

Welch E B et al. "Spherical Navigator Echoes for Full 3D Rigid Body Motion Measurement in MRI" Magnetic Resonance in Medicine, John Wiley & Sons, Inc, US, vol. 47, No. 1, 2002, pp. 32-41, 10 pgs.

Marcus Görge Ullisch, "A Navigator-Based Rigid Body Motion Correction for Magnetic Resonance Imaging", Jan. 24, 2012, 172 pgs.

* cited by examiner

METHOD FOR MEASURING MOTION OF AN OBJECT TO BE IMAGED IN A MEDICAL IMAGING METHOD

FIELD

The disclosure relates to a method for determining movements of an object to be imaged in a medical imaging method which includes at least a Magnetic Resonance Imaging (MRI), a correspondingly arranged magnetic resonance tomograph, and an associated computer program product.

BACKGROUND

So-called navigator scans are short intermediate scans during an MRI examination which read out parts of the k-space. In contrast to external devices for motion measurement, navigators only require the technique that is already used in each magnetic resonance tomograph or MRI scanner. Therefore, navigators are regarded as very practical in daily clinical practice.
In spherical navigators, the surface of a sphere in the k-space is entirely or partially sampled. The sphere is characterized by its radius which is given by the absolute value $k_r$ or the wave vector k. The object to be imaged (e.g. the brain of a patient) is approximated as a rigid body with regard to the negligible deformations during the MRI examination. For rapid and simultaneous measurement of motion of a rigid body with 6 levels of freedom (three levels of rotational freedom and three levels of translational freedom), the current state of the art knows two basic types of spherical navigators: 1. helical spiral navigators and 2. Lissajous navigators. In helical spiral navigators, the surface of the k-space sphere with the radius $k_r$ is scanned on helical spirals. The trajectory usually begins at the equator of the sphere and then moves in a spiral fashion towards the pole. This trajectory is repeated for both hemispheres. In Lissajous navigators, the sphere is sampled on a 3D Lissajous figure.

The scientific publication of Welch et al. (Welch, E. B., Manduca, A., Grimm, R. C., Ward, H. A. and Jack Jr, C. R. Spherical navigator echoes for full 3D rigid body motion measurement in MRI. Magnetic Resonance in Medicine 2002; 47: 32-41.) describes the application of helical spiral navigators for determining motion and in particular of rotations of an object to be scanned in Magnetic Resonance Imaging. The piece of work of Welch et al. particularly describes in connection with FIG. 2 the conflict of objective of the itemization of the signal amplitude which is particularly required for determining a rotation and the associated signal-to-noise ratio (SNR). In the further course, the aforementioned FIG. 2 of the publication of Welch et al. is discussed in more detail as FIG. 4.

Based on the piece of work of Welch et al., the dissertation of Marcus Görge Ullisch "A Navigator-Based Rigid Body Motion Correction for Magnetic Resonance Imaging" of 2012 (http://publications.rwth-aachen.de/record/82888?In=de) discusses the application of spherical Lissajous navigators, in particular for determining rotations. This piece of work also confirms the conflict of objective described by Welch.

SUMMARY

It is an object of the present invention to provide an improved method for determining movements of an object to be imaged, preferably during recording of image data through a magnetic resonance tomograph.

According to a first aspect, a method for determining movements of an object to be imaged in a medical imaging method is provided which includes at least one Magnetic Resonance Imaging. The method comprises the following steps:

determining first coefficients of a mathematical transformation, preferably first coefficients of spherical harmonics, based on first navigator data of the object, wherein the first navigator data are recorded by a magnetic resonance tomograph using a first spherical Lissajous navigator in the k-space with $k_r<0.2$/cm, preferably $k_r<0.15$/cm, and particularly preferably $k_r<0.1$/cm, wherein $k_r$ represents the absolute value of the wave vector k, determining second coefficients of the mathematical transformation, preferably of second coefficients of spherical harmonics, based on second navigator data of the object, wherein the second navigator data are recorded by a magnetic resonance tomograph using a second spherical Lissajous navigator in the k-space with $k_r<0.2$/cm, preferably $k_r<0.15$/cm, and particularly preferably $k_r<0.1$/cm, wherein $k_r$ represents the absolute value of the wave vector k, calculating a rotation of the object using a mathematical optimization based on the first coefficients and the second coefficients.

The method optionally comprises the following further steps:

recording the first navigator data of the object by the magnetic resonance tomograph, recording the second navigator data by the magnetic resonance tomograph.

In contrast to the above-mentioned state of the art, the method particularly enables the determination or measurement of rotations of the object to be imaged for small absolute values of the wave vector. The following disadvantages of the already known methods are particularly avoided:

The pattern-matching algorithms for determining the rotation described in the state of the art (particularly referred to the above-cited piece of work of Welch et al.) are computationally intensive which results in long latency periods between the recording of the navigator and the entire calculation of the motion parameters.

Pattern-matching algorithms also require a sufficiently high feature abundance in the signal magnitude in order to precisely function. Such a high feature abundance can only be achieved by measuring navigators for very large $k_r$, larger than 0.34/cm. However, for large $k_r$, the SNR is low which can also be problematic. Therefore, as mentioned in the description of the state of the art, the optimum $k_r$ is a compromise of feature abundance and SNR.

A further problem for large $k_r$ is that only small translations can be readily determined from the data. The range of translations which can be directly determined from the navigator data is given by $0.5/k_r$. If the translation is larger, a phase-unwrapping algorithm must first be applied, which further increases the computational effort and the time effort associated therewith.

Helical spiral navigators use, as described in the above-mentioned state of the art, k-space trajectories which entail problematic gradient features (high slew rates and amplitude), particularly near the poles.

Helical spiral navigators require two excitation coils, which increases the recording time and strongly intervenes in the magnetic steady state of the main sequence. The above-mentioned piece of work of Welch et al. describes, for example, recording times for helical spiral navigators of more than 25 ms.

Helical spiral navigators cannot be measured for very small $k_r$, since otherwise the amplitude of their z-gradients becomes so small (same order of magnitude as magnetic susceptibility gradients) that die k-space trajectory becomes very imprecise and thus unusable. The required large $k_r$ contribute to the long recording time of more than 25 ms.

The claimed method enables through the small k-space radii $k_r$, which are recorded using the first and second spherical Lissajous navigator, the first and second navigator data to be recorded in very short measuring times without that the accuracy of the determination of the motion data (rotation as well as optionally translation) suffer therefrom. The conflict of objective described in the piece of work of Welch et al. is thus resolved. The motion of an object to be imaged (e.g. the brain of a patient) can thus occur with high accuracy and at the same time more rapidly (and thus also with improved temporal resolution). The measurement of the motion (rotation and optionally translation) of the object to be imaged between two navigator scans (recording of first and second navigator data) can be used, for example, for real-time compensation of the MRI image data of the object to be imaged recorded between the two navigator scans. Alternatively, die calculated rotation and optionally the translation can also be used for subsequent processing of the MRI image data in an external computer or computer system. The motion data can also be recorded, for example in MR-PET measurements, without recording MRI image data. In this case, the motion data can be used for motion correction of the PET measurements. The determination of the translation can thus be carried out by means of the already known methods as they are described, for example, in the above-mentioned pieces of work of Welch et al. (see in particular the chapter "Determination of Translation" on page 33 right column, which is incorporated herein by reference) and Ullisch (see in particular chapter 4.3 starting on page 60, which is incorporated herein by reference). Two, three, four or a plurality of spherical Lissajous navigators can be used for determining the temporal course of a motion of the object during an MRI scan (see e.g. FIG. 6).

The first navigator data preferably comprise first signal amplitudes, and the second navigator data preferably comprise second signal amplitudes, wherein the first signal amplitudes and the second signal amplitudes are preferably each interpolated to a regular grid (e.g. latitude-longitude grids) on a spherical surface. As an alternative to the regular grid, the first coefficients and the second coefficients can also be calculated or interpreted on arbitrary points (e.g. randomly distributed) of the spherical surface. However, the implementation of the calculation on a regular grid has proven to be advantageous with regard to the required computation time on common computers or computer systems.

The first Lissajous navigator and the second Lissajous navigator are preferably specified by the k-space trajectory $k_x = k_r \sin(\omega_\theta t) * \cos(\omega_\phi t)$ $k_y = k_r \sin(\omega_\theta t) * \sin(\omega_\phi t)$ $k_z = k_r \cos(\omega_\theta t)$ wherein t is the time and $\omega_\theta = n_\theta * 2 * \pi / \delta_{nav}$ and $\omega_\phi = n_\phi * 2 * \pi / \delta_{nav}$, wherein $\delta_{nav}$ is the net navigator duration and $n_\theta$ and $n_\phi$ are integrals. The net navigator duration is smaller than 20 ms, preferably smaller than 15 ms, and particularly preferably smaller than 10 ms. $n_\theta$ and $n_\phi$ are preferably selected between 5 and 25. The net navigator duration refers to the time in which the k-space trajectory is located on the spherical surface. The values for $n_\theta$ and $n_\phi$ specify the form and density of the net which is spanned by the Lissajous figure on the spherical surface. Values smaller than 5 do not enable a sufficiently dense coverage of the surface which would be required for a high accuracy in the determination of the rotation. On the contrary, values greater than 25 do not result in a substantial improvement in the determination of the rotation, but, however, lead to a significantly increased time effort for the measurement of the navigator.

The method enables, in particular through the small radii $k_r$ in the k-space, the first and second coefficients to be determined rapidly and with high accuracy (due to the high signal-to-noise ration and the reduced $T_2^*$ effects) based on the measurement points on the spherical surface. Preferably less than 3000 measurement points, preferably less than 2000 measurement point and particularly preferably less than 1000 measurement points are used for determining the first and second coefficients with sufficient accuracy. During the net navigation duration, significantly more (e.g. 10000) very short measurement point can also be recorded which are either summarized or selected such that at the end only, for example, 2000 measurement point are used for determining the coefficients.

The above-described method also enables the first and the second navigators to be determined with respectively only one excitation pulse, which is a high-frequency excitation pulse of the HF coil of the magnetic resonance tomograph. This also reduces the measurement time for the spherical navigators.

The rotation of the object to be imaged is preferably determined using a rotation theorem of the spherical harmonics.

The rotation of the object is preferably determined such that the rotation of the object converts the first coefficients $\hat{f}_{lm}$ of the spherical harmonics optimally into the seconds coefficients of the spherical harmonics by means of the rotation theorem.

The rotation is preferably calculated such that the second coefficients of the spherical harmonics $\hat{f}_{lm}^g$ result according to $$\hat{f}_{lm}^g = e^{-im(\gamma+\pi/2)} \sum_{p=-l}^{l} e^{-ip(\alpha+\pi/2)} \hat{f}_{lp} \sum_{k=-l}^{l} e^{-ik(\beta+\pi)} P_l^{pk}(0) P_l^{km}(0)$$

from the first coefficients of the spherical harmonics. The angles $\alpha$, $\beta$ and $\gamma$ refer to Euler angles in the ZYZ convention. The $p_l^{km}(0)$ refer to generalized associated Legendre polynomials. The angles $\alpha$, $\beta$ and $\gamma$ are preferably calculated by an optimization $$\min_{\alpha,\beta,\gamma} \left( \sum_{l=1}^{l_{max}} \sum_{m=0}^{l} |\hat{f}_{lm}^g - \hat{f}_{lm}|^2 \right).$$

The generalized associated Legendre polynomials are described, for example, in the article of Phinney R. A., Burridge R. "Representation of the elastic-gravitational excitation of a spherical earth model by generalized spherical harmonics". In: Geophysical Journal International 34 (1973), p. 451-487 which is incorporated herein by reference.

The mathematical description presented herein is only one of a plurality of possible representation. Besides the Euler angles in the ZYZ convention, other conventions are possible. Alternatively, the second coefficients $\hat{f}_{lm}{}^g$ of the spherical harmonics can also be calculated using other mathematical methods from the first coefficients of the spherical harmonics $\hat{f}_{lm}{}^g$ (or general following coefficients from the preceding coefficients). As an example, the calculation using the Wigner rotation matrix $U_l^{pm}$ is mentioned at this point. In this case, the second or following coefficients $\hat{f}_{lm}{}^g$ result from:

$$\hat{f}_{lm}^g = \sum_{p=-l}^{l} U_l^{pm}(g) \hat{f}_{lp}.$$

The weightings $U_l^{pm}$ or Wigner rotation matrices are combined with the generalized associated Legendre polynomials as follows:

$$U_l^{pm}(g(\alpha,\beta,\gamma)) = e^{-ip\alpha} {}_p P_l^m(\cos\beta) \cdot e^{-im\gamma},$$

In this case, the rotation is also defined by the Euler angles in ZYZ convention. Details relating to the Wigner rotation matrices can be found, for example, in Michael A. Morrison and Gregory A. Parker "A Guide to Rotations in Quantum Mechanics" In: Australian Journal of Physics 40.4 (1987), p. 465-498, which is incorporated herein by reference.

The above-described method preferably comprises the additional step of calculating a translation of the object directly from the first navigator data and the second navigator data. The range of the translations, which can be directly determined from the navigator data, is significantly larger than in the cited state of the art due to the small $k_r$. With regard to the aforementioned limitation to translations smaller than $0.5/k_r$, it is possible for $k_r<0.2$/cm to calculate translations of more than 2.5 cm and preferably for $k_r<0.1$/cm to calculate translations of more than 5 cm without phase-unwrapping algorithm. Usually, this covers all realistic translations, for example when imaging a head, such that usually no computationally intensive phase-unwrapping algorithm has to be used (see also discussion of FIG. 6).

Between the recording of the first navigator data and the second navigator data, preferably image data of the object are recorded by the magnetic resonance tomograph. Several sequences of image data can thus be corrected in real-time or subsequently by successively determining the rotations between the sequences.

It is alternatively or additionally possible that a recording area (field-of-view) of the magnetic resonance tomograph is adjusted in real-time depending on the calculated rotation and optionally translation. The successive adjustment of the recording area by, for example, the adjustment of the magnetic field gradient, enables a further improvement of the imaging of the object since the relative position of the recording area to the position of the object to be imaged is more stable. This improves the quality of the image reconstruction.

It is a further object of the present invention to provide an improved magnetic resonance tomograph.

The magnetic resonance tomograph comprises a device for generating a static magnet field (e.g. static magnet field coils or alternatively also permanent magnets), gradient coils as wells as a control of the gradient coils coupled to the gradient coils for generating a temporally variable magnetic field gradient, high-frequency coils as well as a high-frequency control coupled to the high-frequency coils for generating excitation pulses, a (preferably adapted to be coupled to an object to be examined, alternatively integrated into the magnetic resonance tomograph) receiving coil, a signal processing system configured to receive measuring data from the receiving coil, as well as a control system coupled to the device for generating the static magnetic field, the controller of the gradient coils, the high-frequency control and the signal processing system. The magnetic resonance tomograph is configured to record first navigator data of the object using a first spherical Lissajous navigator in the k-space with $k_r<0.2$/cm, preferably $k_r<0.15$/cm and particularly preferably $k_r<0.1$/cm, wherein $k_r$ refers to the absolute value of the wave vector k, and to determine first coefficients of a mathematical transformation, preferably first coefficients of spherical harmonics, based on the first navigator data. The magnetic resonance tomograph is further configured to record second and further navigator data of the object using a second spherical Lissajous navigator in the k-space with $k_r<0.2$/cm, preferably $k_r<0.15$/cm and particularly preferably $k_r<0.1$/cm, and to determine second and further coefficients of the mathematical transformation, preferably second and further coefficients of spherical harmonics, based on the second navigator data. The magnetic resonance tomograph is further configured to calculate a rotation of the object using a mathematical optimization based on the first coefficients and the second coefficients.

The determination of the coefficients as well as the calculation of the rotation can be carried out using a calculation system, for example the signal processing system, integrated into the magnetic resonance tomograph. Alternatively, the calculation of the rotation can be carried out in an external calculation system which is included in the magnetic resonance tomograph.

The described components of the magnetic resonance tomograph are of a purely functional nature. The various controls can thus be realized, for example, by a central control and corresponding programs.

The high-frequency control is preferably configured to generate by means of the high-frequency-coils at least one excitation pulse for recording the first navigator data and at least one excitation pulse for recording the second navigator data. The control of the gradient coils is preferably configured to generate by means of the gradient coils the first and the second spherical Lissajous navigator for recording the first and the second navigator data (to realize the k-space trajectory). The receiving coil is preferably configured to record the first and the second navigator data. The first navigator data comprise first signal amplitudes and the second navigator data comprise second signal amplitudes. The signal processing system is configured to receive the first navigator data and the second navigator data by the receiving coil. The signal processing system is further configured to interpole the first signal amplitudes and the second signal amplitudes respectively to a regular grid on a spherical surface. The signal processing system is further configured to calculate the first coefficient of, for example, spherical harmonics by means of the first signal amplitudes. The signal processing system is finally configured to calculate the second coefficients of, for example, spherical harmonics by means of the second signal amplitudes. The calculation of the first and second coefficients as well as the rotation or translation can alternatively also be carried out in the control system.

The magnetic resonance tomograph is preferably configured to adjust a recording area for determining image data of the object depending on the calculated rotation or translation.

According to a further aspect, a computer program product is provided. The computer program product comprises computer code means which can be stored in a storage of an embodiment of the above-described magnetic resonance tomograph or of an evaluation computer. The computer code means are configured such that the method steps according to an embodiment of the above-described method can be performed on a processor of an embodiment of the above-described magnetic resonance tomograph or of an evaluation computer.

Particularly the determination of the first and second coefficients of spherical harmonics based on the first and second navigator data as well as the calculation of the rotation of the object using a mathematical optimization based on the first coefficients and the second coefficients can be performed on an external evaluation computer. In this case, the navigator data are transmitted as raw data in a suitable form from the magnetic resonance tomograph to the evaluation computer.

The storage comprises each suitable storage device, in particular digital storage devices such as optical or solid state storage. The processor comprises each type of microprocessor or application-specific integrated circuit (ASIC).

It is made clear that the above-described magnetic resonance tomograph comprises similar and/or identical embodiments as the method, as they are described in the above description and in particular in the dependent claims.

It is also made clear that the preferred embodiments of the invention also represent every combination of the dependent claims with the corresponding independent claim.

Further preferred embodiments are described in the following.

SHORT DESCRIPTION OF THE DRAWINGS

These and other aspects of the invention are shown in detail in the drawings as follows.

The illustration in the figures is, unless otherwise specified, not precise to scale. The illustration in the figures is exemplary and shall not be regarded as restrictive.

DETAILED DESCRIPTION OF THE EXEMPLARY EMBODIMENTS

Figure 1:
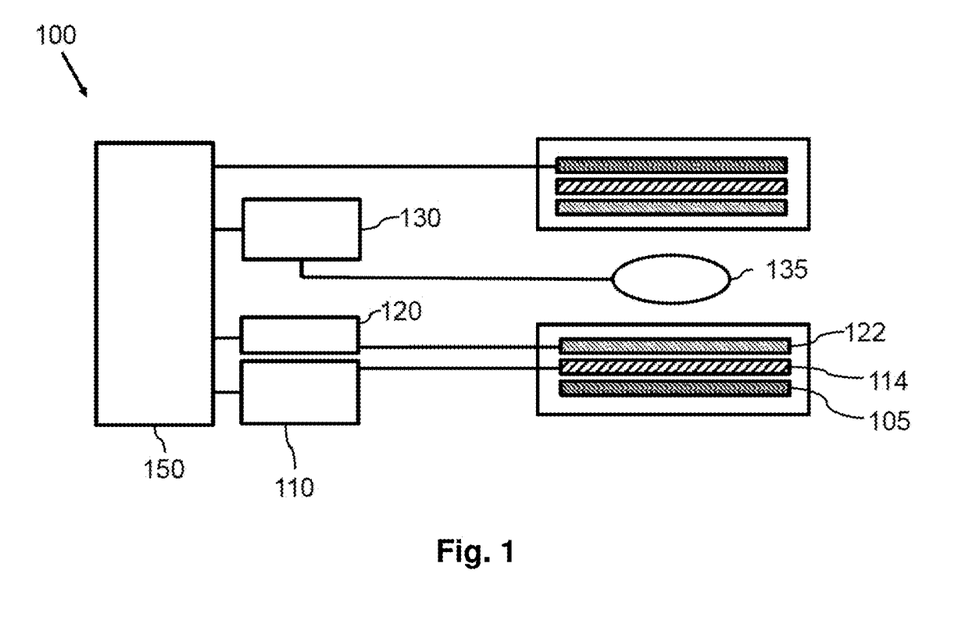
FIG. 1 shows a schematic diagram of a magnetic resonance tomograph.

FIG. 1 shows a schematic diagram of a magnetic resonance tomograph 100. The magnetic resonance tomograph 100 comprises a device for generating a static magnetic field 105 (e.g. static magnetic field coil, permanent magnet etc.) for generating a static magnetic field. The static magnetic field coils, for example, are coupled to a control system 150 which is configured to control the static magnetic field. The magnetic resonance tomograph 100 further comprises gradient coils 114 as well as a control of the gradient coils 110 coupled to the gradient coils 114 for generating a temporally variable magnetic field gradient. The magnetic resonance tomograph 100 finally comprises high-frequency coils 122 as well as a high-frequency control 120 coupled to the high-frequency coils (122) for generating excitation pulses and a receiving coil 135 adapted to be coupled to an object to be examined. Moreover, a signal processing system 130 is configured to receive measurement data received by the receiving oil 135. Besides the static magnetic field coils, the control system 150 is coupled to the control of the gradient coils 110, the high-frequency control 120 and the signal processing system 130. The magnetic resonance tomograph 100 is configured to receive first navigator data of the object using a first spherical Lissajous navigator in the k-space with $k_r$<0.2/cm, preferably $k_r$<0.15/cm and particularly preferably $k_r$<0.1/cm, wherein $k_r$ refers to the absolute value of the wave vector k, and to determine first coefficients of spherical harmonics based on the first navigator data. The magnetic resonance tomograph 100 is further configured to receive second navigator data of the object using a second spherical Lissajous navigator in the k-space with $k_r$<0.2/cm, preferably $k_r$<0.15/cm and particularly preferably $k_r$<0.1/cm, and to determine second coefficients of spherical harmonics based on the second navigator data. The magnetic resonance tomograph 100 is further configured to calculate a rotation of the object using a mathematic optimization based on the first coefficients and the second coefficients.

The determination of the first and second coefficients as well as the calculation of the rotation can be carried out selectively either in the signal processing system 130 or in the control system 150. The magnetic resonance tomograph 100 optionally comprises a non-illustrated interface which is configured to transfer the navigator data without further processing to an external evaluation computer or computer system. The magnetic resonance tomograph 100 further comprises a non-illustrated user interface for the input of measuring programs and optionally for the evaluation of measuring results.

Figure 2:
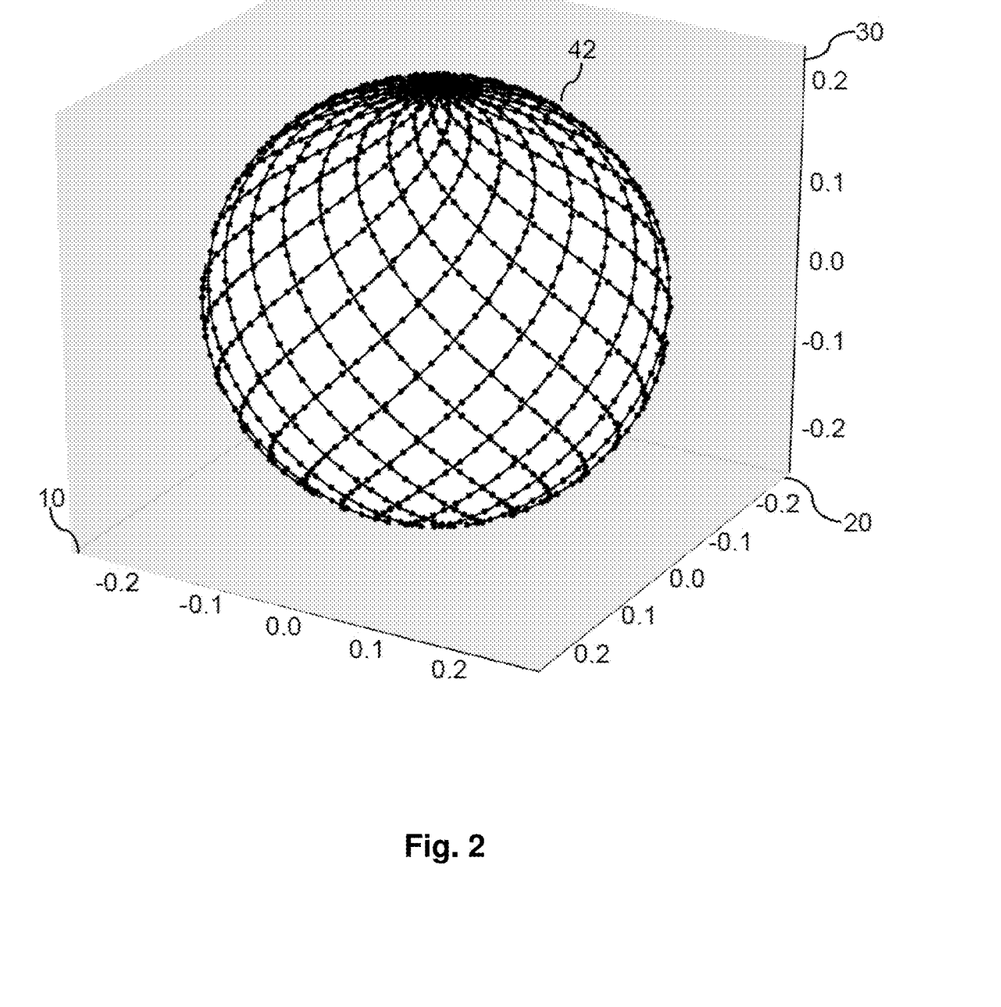
FIG. 2 shows a schematic diagram of a spherical Lissajous navigator.

FIG. 2 shows a schematic diagram of a spherical Lissajous navigator 42 in the k-space with a radius $k_r$ smaller than 0.2/cm. Die axis $k_x$ is designated with 10, the axis $k_y$ with 20 and the axis $k_z$ with 30. The k-space trajectory of the Lissajous navigator can be illustrated mathematically in the already described form:

$$k_x = k_r \sin(\omega_\theta t) * \cos(\omega_\phi t)$$

$$k_y = k_r \sin(\omega_\theta t) * \sin(\omega_\phi t)$$

$$k_z = k_r \cos(\omega_\theta t)$$

wherein t is the time and $\omega_\theta = n_\theta * 2 * \pi / \delta_{nav}$ and $\omega_\phi = n_\phi * 2 * \pi / \delta_{nav}$, wherein $\delta_{nav}$ is the already explained net navigator duration and $n_\theta$ and $n_\phi$ are integrals. The spherical Lissajous navigator 42 shown in FIG. 2 is characterized by $n_\theta = 21$ and $n_\phi = 20$. The black dots symbolize 2000 measurement points which are evenly distributed on the duration $\delta_{nav}$ of the navigator 42. Thus, the dots are evenly distributed on the Lissajous trajectory and can then be interpolated to a regular grid along the latitude and longitude of the spherical surface.

Figure 3:
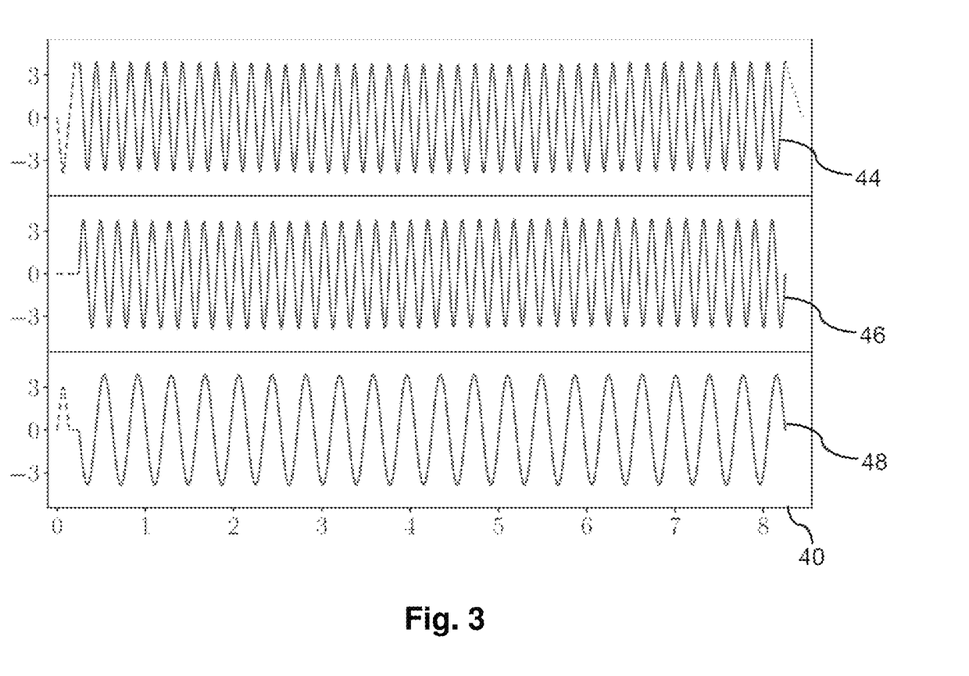
FIG. 3 shows a course of the gradients of a spherical Lissajous navigator.

FIG. 3 shows a course of the magnetic field gradients of a Lissajous navigator for $k_r = 0.1$/cm and $\delta_{nav} = 8$ ms. Line 44 shows the temporal course of the gradient $G_x$[mT/m] along the x-axis. Line 46 shows the temporal course of the gradient $G_y$ [mT/m] along the y-axis. Line 48 shows the temporal course of the gradient $G_z$ [mT/m] along the z-axis. The course is sinusoidal on all axes. The dashed line represents the start-up gradient for reaching the right start position and start direction on the surface of the k-space sphere (see FIG. 2). Said dotted line represents a shut-down gradient which can be replaced, depending on application, by a crusher gradient.

Figure 4:
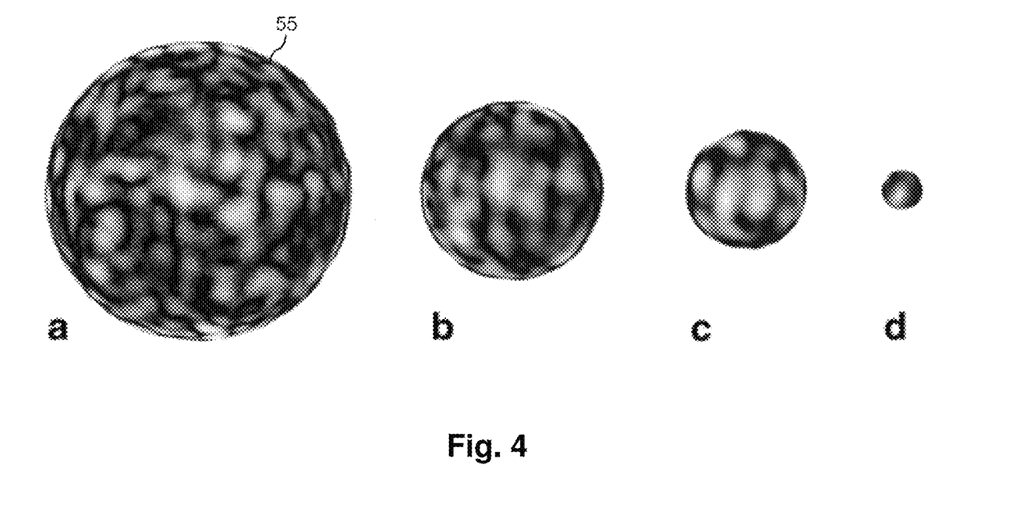
FIG. 4 shows maps of signal amplitude for various values of the absolute value of the wave vector.

FIG. 4 shows a map of signal amplitudes 55 for various values of the absolute value of the wave vector k. FIG. 4 is, as already mentioned before, shown as FIG. 2 in the piece of work of Welch et al. Die maps of the signal amplitudes 55 have been created from left to right in FIG. 4 for a with a radius $k_r$=1/cm, for b with a radius $k_r$=0.63/cm, for c with a radius $k_r$=0.42/cm and for d with a radius $k_r$=0.21/cm. The grey scales represent the signal amplitudes or signal magnitudes, wherein the grey scale levels of the four illustrations are differently normalized. The feature abundance of the signal amplitudes increases with increasing radius, but at the same time the SNR becomes worse. A feature abundance corresponding to the illustration c is, however, required in order to be able to transfer the maps of the signal amplitudes 55 into each other with sufficient accuracy using a pattern matching algorithm after a rotation of the object and thus determine the rotation (see also corresponding explanations in the piece of work of Welch et al.)

Figure 5:
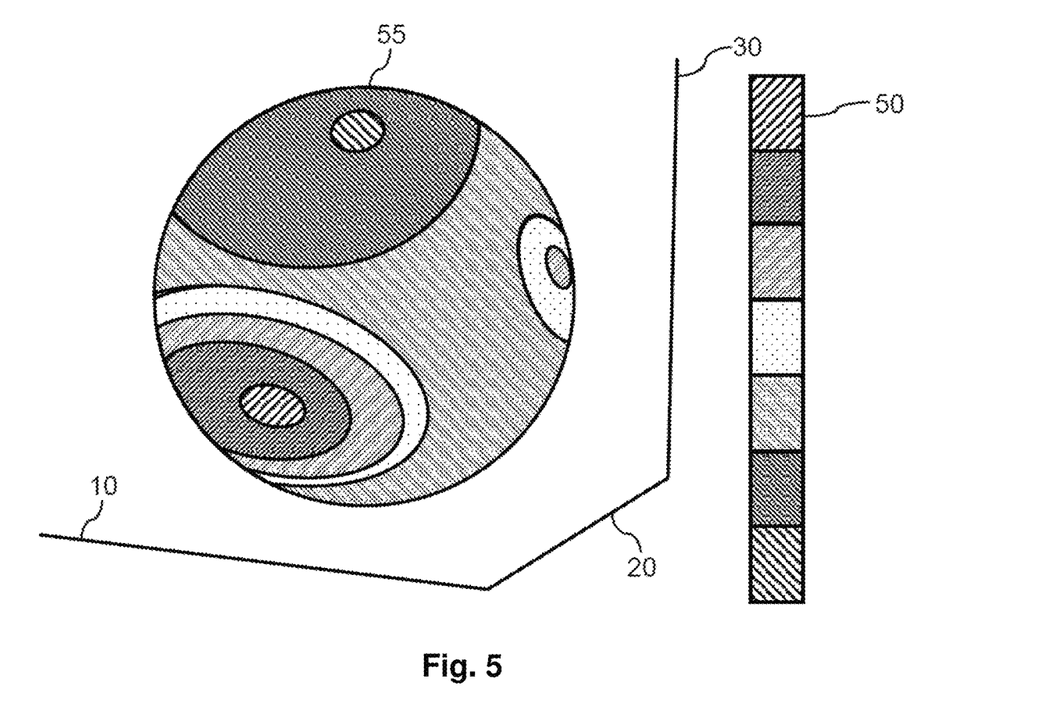
FIG. 5 shows a map of signal amplitudes for an absolute value of the wave vector 0.2/cm.

FIG. 5 shows a map of signal amplitudes 55 for an absolute value of the wave vector 0.2/cm. The feature abundance is very low for such small k-space radii $k_r$ such that a pattern matching algorithm cannot calculate the rotation with sufficient accuracy. To determine the motion between the recording times of two Lissajous navigators, one of them is first specified as reference navigator and the other one as target navigator. The signal amplitude of both Lissajous navigators is then interpolated with an arbitrary method from the Lissajous trajectory to, for example, a regular grid on a spherical surface (latitude-longitude grids) (see FIG. 2). The coefficients of the spherical harmonics (KFF) are then calculated from both data sets on the grid up to a user-selected degree. The rotation determination from the navigator data is carried out by an algorithm from robotics which utilizes a rotation theorem of the KFF (see e.g. Makadia, A. and Daniilidis, K. "Direct 3d-rotation estimation from spherical images via a generalized shift theorem". Proceedings of the 2003 IEEE Computer Society Conference on Computer Vision and Pattern Recognition 2: 11-217, 2003, in particular chapter 2 and chapter 3 and Makadia, A., Sorgi, L. and Daniilidis, K. "Rotation estimation from spherical images". Proceedings of the 17th International Conference on Pattern Recognition, 2004, 3:590-593, 2004, in particular chapter 2 and chapter 3, which are incorporated herein by reference). The rotation theorem of the KFF says that the coefficients of the KFF change under an arbitrary rotation g ($\alpha$, $\beta$, $\gamma$) according to the already mentioned formula:

$$\hat{f}_{lm}^g = e^{-im(\gamma+\pi/2)} \sum_{p=-l}^{l} e^{-ip(\alpha+\pi/2)} \hat{f}_{lp} \sum_{k=-l}^{l} e^{-ik(\beta+\pi)} P_l^{pk}(0) P_l^{km}(0)$$

The angles $\alpha$, $\beta$ and $\gamma$ can then be calculated by the already described optimization $$\min_{\alpha,\beta,\gamma} \left( \sum_{l=1}^{l_{max}} \sum_{m=0}^{l} |\hat{f}_{lm}^g - \hat{f}_{lm}|^2 \right).$$

The translation determination is carried out in the aforementioned manner.

The application of spherical Lissajous navigators for small $k_r$ makes it possible to record the entire navigator in less than 8 ms with only a single excitation pulse. The measurement time is thus significantly shorter than for helical spiral navigators, which reduces unintentional $T_2^*$ effects. Moreover, the method intervenes less in the steady state of the main sequence (recording of image data) than all helical spiral navigators known so far in literature. The described algorithm is able to calculate precise rotation parameters from spherical data which have a small feature abundance in the signal amplitude or signal magnitude due to the small $k_r$. Due to the possibility to measure with Lissajous navigators at small $k_r$, the SNR is only high enough to apply the above-described algorithm. For low SNR, the algorithm does not provide reliable results. In addition, this algorithm requires minimal computational effort, which enables real-time applications.

Figure 6:
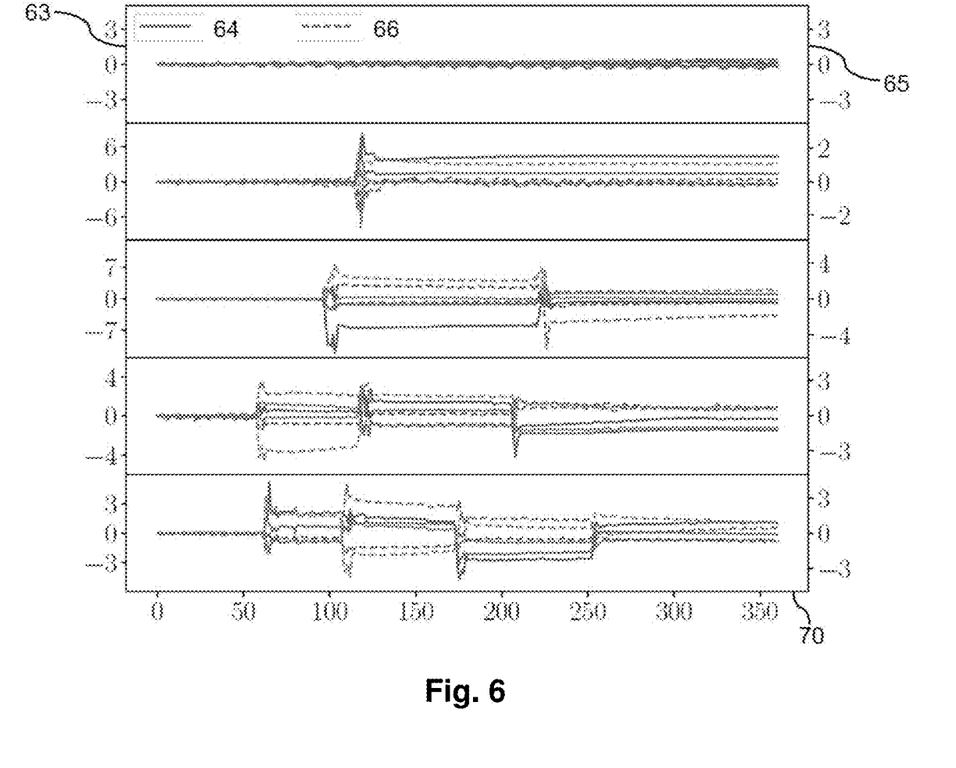
FIG. 6 shows results of a rotation and translation determination.

FIG. 6 shows results of a rotation and translation determination using a number of consecutive spherical Lissajous navigators 70 which have been recorded during an MRI scan over time to determine the motions of the object to be imaged during the MRI scan. The Lissajous navigators are characterized by a k-space radius $k_r$=0.1/cm, $n_\theta$=11 and $n_\phi$=10 und $\delta_{nav}$=4.4 ms. 1100 measurement point have been used for the interpolation on the spherical surface. FIG. 6 shows 5 measurements of a human head under real measurement conditions. On the left side the respective rotations [°] 63 and on the right side the translations [mm] 65 are illustrated. The solid lines 64 represent the rotation about the three rotation axes as a function of time or of the consecutive navigators 70. The dashed lines 66 represent the translations along the three spatial axes as a function of time or of the consecutive navigators 70. The five measurement series show (from top to bottom) 0 to 4 intentional head movements during the MRI scan. The measurement results show that particularly the rotations 63 can be determined with high accuracy. Moreover, the measurement results show that the translational motions are so small that for small k-space radius the translations can be determined directly from the measurement data, as discussed before.

Figure 7:
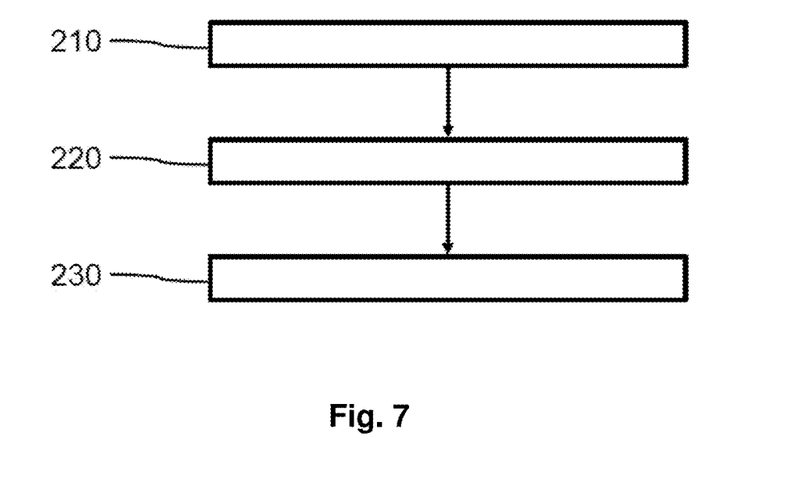
FIG. 7 shows a schematic diagram of the process flow.

FIG. 7 shows a schematic diagram of the process flow. In step 210, first coefficients of spherical harmonics are determined based on first navigator data of the object, wherein the first navigator data are recorded by an magnetic resonance tomograph using a first spherical Lissajous navigator in the k-space with $k_r$<0.2/cm, preferably $k_r$<0.15/cm and particularly preferable $k_r$<0.1/cm, wherein $k_r$ refers to the absolute value of the wave vector k. In step 220, second coefficients of spherical harmonics are determined based on second navigator data of the object, wherein the second navigator data are recorded by an magnetic resonance tomograph using a second spherical Lissajous navigator in the k-space with $k_r$<0.2/cm, preferably $k_r$<0.15/cm and particularly preferable $k_r$<0.1/cm. The calculation of a rotation of the object is carried out in step 230 using a mathematical optimization based on the first coefficients and the second coefficients.

Further variants of the inventions and its embodiment result for the person skilled in the art from the preceding disclosure, the figures and the patent claims.

Terms such as "comprise", "include", "have", "contain" and the like, which are used in the patent claims, do not exclude further elements or steps. The use of the indefinite article does not exclude a plurality. A single device can execute the functions of several units or devices mentioned in the patent claims. Reference numerals indicated in the patent claims shall not be regarded as limitations of the applied means and steps.

LIST OF REFERENCE NUMERALS

10 $k_x$ [1/cm]
20 $k_y$ [1/cm]
30 $k_z$ [1/cm]
40 time
42 spherical Lissajous navigator
44 $G_x$ [mT/m]
46 $G_y$ [mT/m]
48 $G_z$ [mT/m]
50 signal amplitude [any unit]
55 map of signal amplitude of a spherical navigator
63 rotation [°]
64 rotations as a function of time
65 translation [mm]
66 translations as a function of time
70 navigators
100 magnetic resonance tomograph
105 device for generating static magnetic fields
110 control of gradient coils
114 gradient coil
120 high-frequency control
122 high-frequency coil
130 signal processing system
135 receiving coil
150 control system
210 determination of first coefficients
220 determination of second coefficients
230 calculation of object rotation

The invention claimed is:

1. A method for determining one or more movements of an object to be imaged in a medical imaging method, said medical imaging method comprising at least Magnetic Resonance Imaging, wherein the method comprises steps of:
   determining a first set of functions based on first navigator data of the object, and determining first coefficients of the first set of functions, wherein the first navigator data is recorded by a magnetic resonance tomograph using a first spherical Lissajous navigator in k-space with $k_r$<0.2/cm, wherein $k_r$ represents an absolute value of the wave vector k,
   determining a second set of functions based on second navigator data of the object, and determining second coefficients of the second set of functions, wherein the second navigator data is recorded by the magnetic resonance tomograph using a second spherical Lissajous navigator in the k-space with $k_r$<0.2/cm, wherein $k_r$ represents the absolute value of the wave vector k,
   calculating a rotation of the object based on the first coefficients and the second coefficients, wherein calculating the rotation comprises determining a relationship between each first coefficient in the first coefficients and each second coefficient in the second coefficients, said relationship governed by a rotation matrix selected from one of: an Euler rotation matrix and a Wigner rotation matrix, and
   adjusting a recording area of the magnetic resonance tomograph based on the rotation of the object.

2. The method according to claim 1, wherein the first coefficients are first coefficients of spherical harmonics, and wherein the second coefficients are second coefficients of spherical harmonics.

3. The method according to claim 1, wherein the method comprises further steps of:
   recording the first navigator data of the object by the magnetic resonance tomograph,
   recording the second navigator data by the magnetic resonance tomograph.

4. The method according to claim 1, wherein the first navigator data comprise first signal amplitudes, and the second navigator data comprise second signal amplitudes, wherein the first signal amplitudes and the second signal amplitudes are each interpolated to a regular grid on a spherical surface.

5. The method according to claim 1, wherein the first spherical Lissajous navigator and the second spherical Lissajous navigator are determined by a k-space trajectory $$k_x = k_r \sin(\omega_\theta t) * \cos(\omega_\phi t)$$

$$k_y = k_r \sin(\omega_\theta t) * \sin(\omega_\phi t)$$

$$k_z = k_r \cos(\omega_\theta t)$$

wherein t is time and $\omega_\theta = n_\theta * 2 * \pi / \delta_{nav}$ and $\omega_\phi = n_\phi * 2 * \pi / \delta_{nav}$, wherein $\delta_{nav}$ is a net navigator duration and $n_\theta$ and $n_\phi$ are integrals, wherein the net navigator duration is smaller than 20 ms, preferably smaller than 15 ms, and particularly preferably smaller than 10 ms, and wherein no and no are between 5 and 25.

6. The method according to claim 2, wherein the rotation of the object is determined by a rotation theorem of the spherical harmonics.

7. The method according to claim 6, wherein the rotation of the object is determined by the rotation theorem by converting the first coefficients of the spherical harmonics into the second coefficients of the spherical harmonics via the rotation theorem.

8. The method according to claim 7, wherein the second coefficients of the spherical harmonics $\hat{f}_{lm}^g$ result according to $$\hat{f}_{lm}^g = e^{-im(\gamma+\pi/2)} \sum_{p=-l}^{l} e^{-ip(\alpha+\pi/2)} \hat{f}_{lp} \sum_{k=-l}^{l} e^{-ik(\beta+\pi)} P_l^{pk}(0) P_l^{km}(0)$$

from the first coefficients of the spherical harmonics $\hat{f}_{lm}$, wherein the angles $\alpha$, $\beta$ and $\gamma$ refer to Euler angles in a ZYZ convention, $P_l^{km}(0)$ refer to generalized associated Legendre polynomials, and the angles $\alpha$, $\beta$ and $\gamma$ are calculated by the optimization $$\min_{\alpha,\beta,\gamma} \left( \sum_{l=1}^{l_{max}} \sum_{m=0}^{l} |\hat{f}_{lm}^g - \hat{f}_{lm}|^2 \right).$$

9. The method according to claim 1, wherein a translation of the object is calculated directly from the first navigator data and the second navigator data.

10. The method according to claim 1, wherein between recording the first navigator data and the second navigator data, image data of the object is recorded by the magnetic resonance tomograph.

11. The method according to claim 1, wherein one or both of the first navigator data and the second navigator data are recorded with $k_r<0.15/cm$.

12. The method according to claim 1, wherein one or both of the first navigator data and the second navigator data are recorded with $k_r<0.1/cm$.

13. A magnetic resonance tomograph comprising:
a device for generating a static magnetic field,
one or more gradient coils and a gradient coil controller coupled to the gradient coils, said one or more gradient coils and gradient coil controller configured to generate a temporally variable magnetic field gradient,
one or more high-frequency coils and a high-frequency controller coupled to the high-frequency coils, the one or more high-frequency coils and high-frequency control element configured for generating excitation pulses,
a receiving coil,
a signal processing system configured to receive measuring data from the receiving coil, and
a control system coupled to the device for generating the static magnetic field, the gradient coil controller, the high-frequency controller and the signal processing system,
wherein the magnetic resonance tomograph is configured to record first navigator data of the object using a first spherical Lissajous navigator in k-space with $k_r<0.2/cm$, wherein $k_r$ refers to an absolute value of a wave vector k, and to determine a first set of functions based on first navigator data of the object and first coefficients of the first set of functions, wherein the magnetic resonance tomograph is further configured to record second navigator data of the object using a second spherical Lissajous navigator in the k-space with $k_r<0.2/cm$, and to determine second set of functions based on second navigator data of the object and second coefficients of the second set of functions, and wherein the magnetic resonance tomograph is further configured to calculate a rotation of the object based on the first coefficients and the second coefficients, wherein calculating the rotation comprises determining a relationship between each first coefficient in the first coefficients and each second coefficient in the second coefficients, said relationship governed by a rotation matrix selected from one of: an Euler rotation matrix and a Wigner rotation matrix, and
wherein the magnetic resonance tomograph is configured to adjust a recording area for determining image data of the object based on the rotation of the object.

14. The magnetic resonance tomograph according to claim 13, wherein the high-frequency controller is configured to generate, with the high-frequency-coils, at least one excitation pulse for recording the first navigator data and at least one excitation pulse for recording the second navigator data,
wherein the receiving coil is configured to record the first and the second navigator data, wherein the first navigator data comprises first signal amplitudes and the second navigator data comprises second signal amplitudes,
wherein the signal processing system is configured to receive the first navigator data and the second navigator data by the receiving coil, wherein the signal processing system is configured to interpole the first signal amplitudes and the second signal amplitudes respectively to a regular grid on a spherical surface, and
wherein the signal processing system is configured to calculate the first coefficients based on the first signal amplitudes, wherein the first coefficients are first coefficients of spherical harmonics, and wherein the signal processing system is configured to calculate the second coefficients based on the second signal amplitudes, wherein the second coefficients are second coefficients of spherical harmonics.

15. The magnetic resonance tomograph according to claim 13, wherein the magnetic resonance tomograph is configured to record one or both of the first navigator data and the second navigator data with $k_r<0.15/cm$.

16. The magnetic resonance tomograph according to claim 13, wherein the magnetic resonance tomograph is configured to record one or both of the first navigator data and the second navigator data with $k_r<0.1/cm$.

17. A non-transitory computer-readable medium comprising computer program code that, when stored in a storage of a magnetic resonance tomograph, is configured to configure the magnetic resonance tomograph to perform a plurality of method steps, the magnetic resonance tomograph comprising:
a device for generating a static magnetic field,
one or more gradient coils and a gradient coil controller coupled to the gradient coils-said one or more gradient coils and gradient coil controller configured to generate a temporally variable magnetic field gradient,
one or more high-frequency coils and a high-frequency controller coupled to the high-frequency coils, the one or more high-frequency coils and high-frequency control element configured for generating excitation pulses,
a receiving coil,
a signal processing system configured to receive measuring data from the receiving coil,
a control system coupled to the device for generating the static magnetic field, the gradient coil controller, the high-frequency control and the signal processing system,
wherein the magnetic resonance tomograph is configured to record first navigator data of the object using a first spherical Lissajous navigator in the k-space with $k_r<0.2/cm$, wherein $k_r$ refers to an absolute value of a wave vector k, and to determine a first set of functions based on first navigator data of the object and first coefficients of the first set of functions, wherein the magnetic resonance tomograph is further configured to record second navigator data of the object using a second spherical Lissajous navigator in the k-space with $k_r<0.2/cm$, and to determine second set of functions based on second navigator data of the object and second coefficients of the second set of functions, and wherein the magnetic resonance tomograph is further configured to calculate a rotation of the object based on the first coefficients and the second coefficients; and
an evaluation computer,
wherein the plurality of method steps comprise:
determining, with the magnetic resonance tomograph, the first coefficients and the second coefficients,
calculating the rotation of the object based on the first coefficients and the second coefficients,
wherein calculating the rotation comprises determining a relationship between each first coefficient in the first coefficients and each second coefficient in the second coefficients, said relationship governed by a rotation matrix selected from one of: an Euler rotation matrix and a Wigner rotation matrix, and adjusting a recording area of the magnetic resonance tomograph based on the rotation of the object.

18. The non-transitory computer-readable medium according to claim 17, wherein the non-transitory computer-readable medium is configured to configure the magnetic resonance tomograph to record one or both of the first navigator data and the second navigator data with $k_r<0.15/$cm.

19. The non-transitory computer-readable medium according to claim 17, wherein the non-transitory computer-readable medium is configured to configure the magnetic resonance tomograph to record one or both of the first navigator data and the second navigator data with $k_r<0.1/$cm.

\* \* \* \* \*